US008742509B2

(12) United States Patent
Lee et al.

(10) Patent No.: US 8,742,509 B2
(45) Date of Patent: Jun. 3, 2014

(54) APPARATUS AND METHOD FOR FINFETS

(75) Inventors: Yi-Jing Lee, Hsin-Chu (TW); You-Ru Lin, New Taipei (TW); Cheng-Tien Wan, Tainan (TW); Cheng-Hsien Wu, Hsin-Chu (TW); Chih-Hsin Ko, Fongshan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/410,073

(22) Filed: Mar. 1, 2012

(65) Prior Publication Data
US 2013/0228875 A1 Sep. 5, 2013

(51) Int. Cl.
*H01L 21/70* (2006.01)
(52) U.S. Cl.
USPC ............ 257/368; 257/374; 257/395; 257/396; 257/401; 257/521
(58) Field of Classification Search
CPC ............ H01L 21/76224; H01L 21/823814; H01L 21/823821; H01L 21/823878
USPC ......... 257/240, 244, 259, 395, 396, 397, 401, 257/559, E29.039, E29.04, E29.051, 257/E29.052, E29.067, E29.26, E29.262, 257/E29.299, 374, 509, 510, 521, 524; 438/222
See application file for complete search history.

(56) References Cited

U.S. PATENT DOCUMENTS

| | | | |
|---|---|---|---|
| 7,154,118 B2 * | 12/2006 | Lindert et al. | 257/66 |
| 7,385,247 B2 | 6/2008 | Rhee et al. | |
| 7,547,637 B2 * | 6/2009 | Brask et al. | 438/717 |
| 7,723,193 B2 | 5/2010 | Rhee et al. | |
| 8,183,134 B2 * | 5/2012 | Wu et al. | 438/481 |
| 8,349,692 B2 * | 1/2013 | Tan et al. | 438/270 |
| 8,598,675 B2 * | 12/2013 | Wang | 257/506 |
| 2005/0156202 A1 * | 7/2005 | Rhee et al. | 257/213 |
| 2008/0116517 A1 | 5/2008 | Anderson et al. | |
| 2009/0039361 A1 * | 2/2009 | Li et al. | 257/94 |
| 2011/0024794 A1 * | 2/2011 | Ko et al. | 257/190 |
| 2012/0168821 A1 * | 7/2012 | Cheng et al. | 257/192 |
| 2012/0228676 A1 * | 9/2012 | Tan et al. | 257/255 |
| 2013/0049068 A1 * | 2/2013 | Lin et al. | 257/192 |

FOREIGN PATENT DOCUMENTS

| | | | |
|---|---|---|---|
| KR | 20050075697 A | 7/2000 | |
| KR | 20080099687 A | 11/2008 | |

* cited by examiner

*Primary Examiner* — Fernando L Toledo
*Assistant Examiner* — Christine C. Lau
(74) *Attorney, Agent, or Firm* — Slater and Matsil, L.L.P.

(57) ABSTRACT

A FinFET comprises an isolation region formed in a substrate, a cloak-shaped active region formed over the substrate, wherein the cloak-shaped active region has an upper portion protruding above a top surface of the isolation region. In addition, the FinFET comprises a gate electrode wrapping the channel of the cloak-shaped active region.

13 Claims, 9 Drawing Sheets

APPARATUS AND METHOD FOR FINFETS

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS) field effect transistor (FET), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source. However, as semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a fin field effect transistor (FinFET) having a cloak-shaped active region. The embodiments of the disclosure may also be applied, however, to a variety of semiconductor devices. Hereinafter, various embodiments will be explained in detail with reference to the accompanying drawings.

Figure 1:
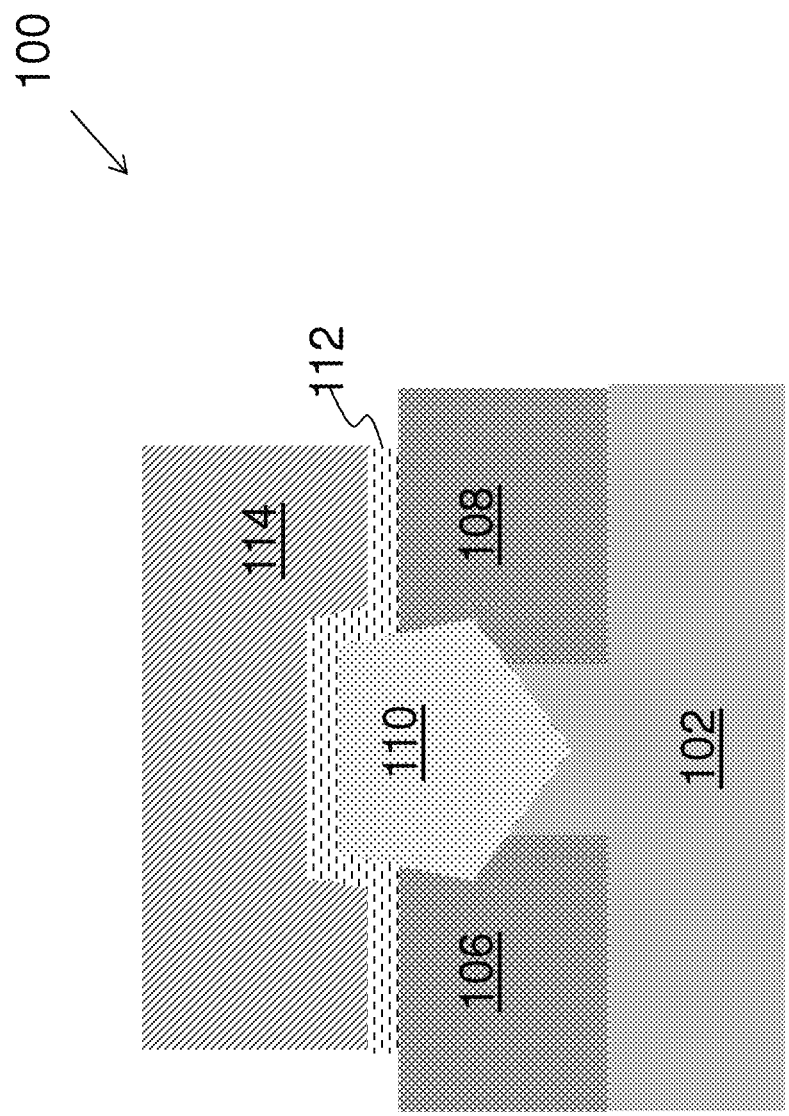
FIG. 1 illustrates a cross sectional view of a FinFET having cloak-shaped active regions in accordance with an embodiment.

FIG. 1 illustrates a cross sectional view of a FinFET having cloak-shaped active regions in accordance with an embodiment. The FinFET 100 is formed over a substrate 102. The FinFET 100 comprises a cloak-shaped active region 110 from a cross section view. More particularly, the cloak-shaped active region 110 may comprise a first drain/source region, a second drain/source region and a channel connected between the first drain/source region and the second drain/source region (not shown respectively). As shown in FIG. 1, the cloak-shaped active region 110 is located between two isolation regions, namely, a first isolation region 106 and a second isolation region 108. In accordance with an embodiment, both the first isolation 106 and the second isolation region 108 may be implemented by using a shallow trench isolation (STI) structure.

The FinFET 100 may further comprise a gate electrode 114 formed over the cloak-shaped active region 110. More particularly, a gate dielectric layer 112 is formed between the cloak-shaped active region 110 and the gate electrode 114. As shown in FIG. 1, the gate dielectric layer 112 is deposited on top of the cloak-shaped active region 110 as well as the isolation regions 106 and 108. The method of fabricating the FinFET 100 will be described below with respect to FIGS. 2-9 in accordance with an embodiment.

An advantageous feature of having a cloak-shaped active region 110 is that before an silicon germanium epitaxial growth process, a cloak-shaped recess (not shown but illustrated in FIG. 4) provides a clean surface for the subsequent epitaxial growth. As a result, a single crystalline silicon germanium epitaxial layer may be grown in the cloak-shaped trench. Such a single crystalline silicon germanium epitaxial layer helps to improve the crystal quality of the channel of the FinFET 100.

Figure 2:
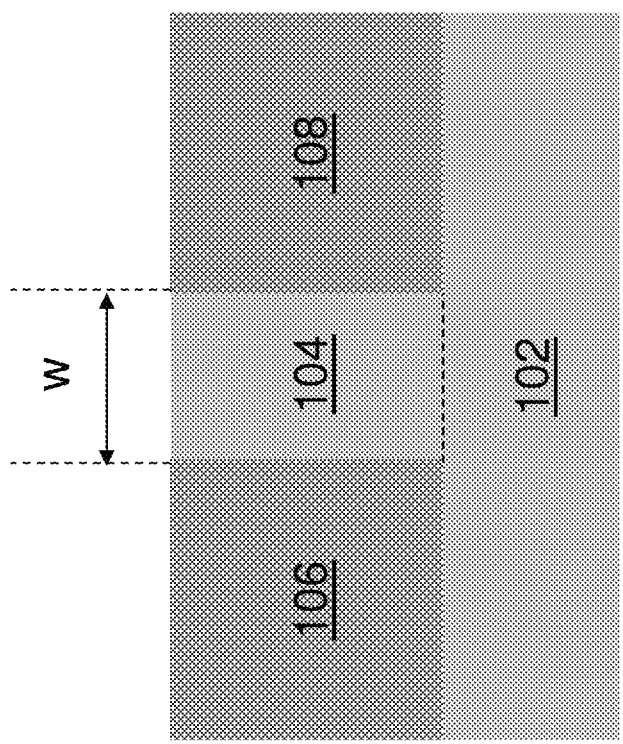
FIG. 2 illustrates a cross sectional view of a semiconductor substrate having a plurality of isolation regions in accordance with an embodiment.

FIG. 2 illustrates a cross sectional view of a semiconductor substrate having a plurality of isolation regions in accordance with an embodiment. The substrate 102 may be a silicon substrate. Alternatively, the substrate 102 may comprise other semiconductor materials such as germanium, compound semiconductor materials such as silicon carbide, gallium arsenide, indium arsenide, indium phosphide and the like. In accordance with an embodiment, the substrate 102 may be a crystalline structure. In accordance with another embodiment, the substrate 102 may be a silicon-on-insulator (SOI) substrate.

Isolation regions 106 and 108 are formed in substrate 102. In accordance with an embodiment, isolation regions 106 and 108 are implemented by STI structures. The STI structures (e.g., isolation region 106) may be fabricated by using suitable techniques including photolithography and etching processes. In particular, the photolithography and etching processes may comprise depositing a commonly used mask material such as photoresist over the substrate 102, exposing the mask material to a pattern, etching the substrate 102 in accordance with the pattern. In this manner, a plurality of openings may be formed as a result. The openings are then filled with dielectric materials to form the STI structures (e.g., isolation regions 106 and 108). A chemical mechanical polishing (CMP) process is then performed to remove excess portions of the dielectric materials, and the remaining portions are the isolation regions 106 and 108.

As shown in FIG. 2, the isolation regions 106 and 108 have their sidewalls facing each other. It should be noted while FIG. 2 illustrates two separate isolation regions 106 and 108, the isolation regions 106 and 108 may be portions of a continuous region, which may form an isolation ring in accordance with an embodiment. The upper portion 104 of the substrate 102 is between, and adjoins, the isolation regions 106 and 108. Width W of the upper portion 104 may be small. In accordance with an embodiment, width W is less than about 50 nm. It is appreciated that the dimensions recited throughout the description are merely examples, and may be changed to different values.

Figure 3:
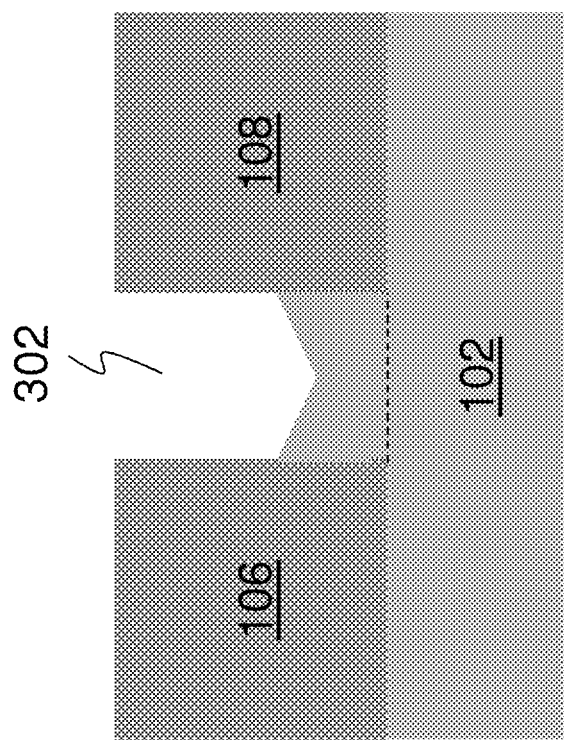
FIG. 3 illustrates a cross sectional view of the substrate shown in FIG. 2 after a portion of the substrate has been removed in accordance with an embodiment.

FIG. 3 illustrates a cross sectional view of the substrate shown in FIG. 2 after a portion of the substrate has been removed in accordance with an embodiment. An upper portion of substrate portion 104 (shown in FIG. 2) is removed, forming a V-shaped groove 302. In accordance with an embodiment, the bottom of the V-shaped groove 302 is higher than the bottom surfaces of isolation regions 106 and 108. In accordance with another embodiment, the bottom of the V-shaped groove 302 may be substantially level with or lower than the bottoms of the isolation regions 106 and 108.

The upper portion of the substrate portion 104 may be removed using suitable techniques. More particularly, the V-shaped groove 302 may be achieved using an etching process. For example, a patterned mask (not shown), such as a photoresist mask and/or a hard mask, is formed over the top surface of the isolation regions 106 and 108 using deposition and photolithography techniques. Thereafter, an etching process, such as a reactive ion etch (RIE) or other dry etch, an anisotropic wet etch, or any other suitable anisotropic etch processes, is performed to form the V-shaped groove 302. In accordance with an embodiment, etchants such as tetramethylammonium hydroxide (TMAH) may be employed to perform an anisotropic wet etching process. Such an anisotropic wet etching process may have a TMAH concentration of about 3-5%. The etching process may be performed under a temperature in a range from about 20° to about 35° C.

As shown in FIG. 3, the V-groove shaped bottom has an interior angle. In accordance with an embodiment, the interior angle is in a range from about 100 degrees to about 110 degrees. One advantageous feature of having a V-shaped groove as shown in FIG. 3 is that the V-shaped groove helps to improve the quality of the subsequent silicon germanium epitaxial growth.

Figure 4:
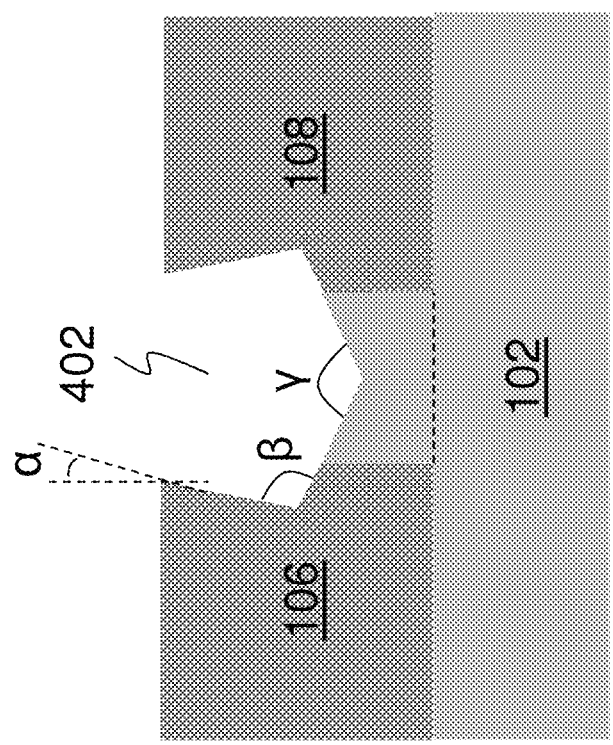
FIG. 4 illustrates a cross sectional view of the substrate shown in FIG. 3 after a surface treatment is performed in accordance with an embodiment.

FIG. 4 illustrates a cross sectional view of the substrate shown in FIG. 3 after a surface treatment is performed in accordance with an embodiment. A surface treatment is performed to treat the exposed surface of the substrate 102, wherein the exposed surface is inside the V-shaped groove. The surface treatment may be performed in a chamber (not shown) capable of having a vacuumed environment. The process gases of the treatment include an oxygen-containing gas and an etching gas, which may be used simultaneously. The etching gas has the function of etching the substrate 102. In accordance with an embodiment, the oxygen-containing gas includes oxygen ($O_2$), ozone ($O_3$), or combinations thereof. The etching gas may include a fluorine-containing gas such as $CF_4$. In accordance with another embodiment, the etching gas may include a chlorine-containing gas such as HCl. During the surface treatment, a flow rate ratio, which is the ratio of the flow rate of the oxygen-containing gas to a total flow rate of the oxygen-containing gas and the etching gas, may be in a range from about 0.99 to about 0.995. The total pressure of the oxygen-containing gas and the etching gas may be in a range from about 500 mTorr to about 1.5 Torr. In accordance with yet another embodiment, the surface treatment may include a plasma treatment, wherein the respective radio frequency (RF) power of the plasma may be in a range from about 1,100 Watts to about 1,500 Watts. During the surface treatment, the substrate 102 may be heated to a temperature in a range from about 150° to about 300° C.

Due to the surface treatment, the surface of the substrate 102 has been improved. The pits and islands that are formed on the surface of the substrate 102 are removed. In addition, as shown in FIG. 4, portions of the sidewalls of the isolation regions (e.g., isolation region 106) are removed due to the surface treatment. As a result, a cloak-shaped recess 402 is formed. Such a cloak-shaped recess helps to improve the crystal quality of the subsequent epitaxial growth. The epitaxial growth will be described below with respect to FIG. 5.

The cloak-shaped recess 402 may be defined by three angles. As shown in FIG. 4, the sidewall of the isolation region 106 is non-vertical. The deviation of the sidewall from the vertical is defined by a first angle $\alpha$. In accordance with an embodiment, the first angle $\alpha$ is in a range from about 0 degrees to about 20 degrees. The turning point between the non-vertical sidewall and the V-shaped groove can be defined by a second angle $\beta$. In accordance with an embodiment, the second angle $\beta$ is in a range from about 130 degrees to about 160 degrees. The V-shaped groove can be defined by a third angle $\gamma$. In accordance with an embodiment, the third angle $\gamma$ is in a range from about 100 degrees to about 110 degrees.

After the surface treatment, a cleaning process may be performed on substrate 102 as well as the sidewalls of the isolation regions 106 and 108. The cleaning process may be employed to remove the native oxide, if any, that is formed on the surface of the substrate 102. In accordance with an embodiment, the cleaning process may be implemented by using a diluted HF solution and/or a high temperature H2 bake process.

Figure 5:
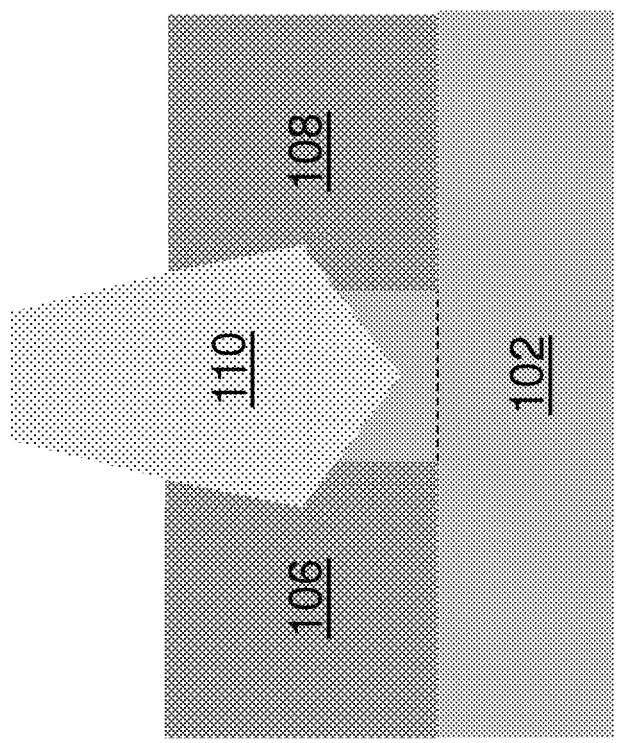
FIG. 5 illustrates a cross sectional view of the substrate shown in FIG. 4 after an epitaxial silicon germanium layer is grown in the recess of the substrate in accordance with an embodiment.

FIG. 5 illustrates a cross sectional view of the substrate shown in FIG. 4 after an epitaxial silicon germanium region is grown in the cloak-shaped recess of the substrate in accordance with an embodiment. Silicon germanium may be grown in the cloak-shaped recess 402 (shown in FIG. 4) using suitable techniques such as selective epitaxial growth (SEG) to form a cloak-shaped epitaxial region 110. In accordance with an embodiment, either n-type dopants such as boron or p-type dopants such as phosphorous may be in-situ doped with the proceeding of the epitaxial growth. Alternatively, the epitaxial layer may be doped using other suitable techniques such as ion implantation, diffusion and the like. As shown in FIG. 5, the top surface of the cloak-shaped epitaxial region 110 may be grown to a level higher than the top surface of the isolation regions (e.g., isolation region 106).

In accordance with an embodiment, the cloak-shaped epitaxial region 110 may comprise germanium. Alternatively, the cloak-shaped epitaxial region 110 may include silicon germanium. The epitaxial layer may be grown by using a CMOS compatible epitaxial process. The CMOS compatible epitaxial process may comprise CVD or the like.

Depending on the desirable composition of the cloak-shaped epitaxial region 110, the precursors for the epitaxial growth may include silicon containing gases and germanium containing gases, such as SiH4 and GeH4, and/or the like, and the partial pressures of the silicon containing gases and germanium containing gases are adjusted to modify the atomic ratio of germanium to silicon. In accordance with an embodiment, the silicon germanium of the cloak-shaped epitaxial region 110 may be expressed as $Si_{1-x}Ge_x$, wherein x is the atomic percentage of germanium, and may be in the range between 0 and 1. In accordance with an embodiment, the cloak-shaped epitaxial region 110 comprises substantially pure germanium (with x equal to 1). Alternatively, the cloak-shaped epitaxial region 110 may comprise a low germanium concentration. For example, x is in a range from about 0.1 to about 0.3.

In accordance with another embodiment, the cloak-shaped epitaxial region 110 may include other semiconductor materials such as silicon carbon, substantially pure silicon, III-V compound semiconductor materials such as GaN, AlAs, GaN, InN, AlN, $In_xGa_{(1-x)}N$, $Al_xGa_{(1-x)}N$, $Al_xIn_{(1-x)}N$, $Al_x In_yGa_{(1-x-y)}N$, and combinations thereof, wherein each of x and y may be in a range from about 0 to about 1.

In accordance with an embodiment, the lower portion and the upper portion of the cloak-shaped epitaxial region 110 may have different compositions. For example, the lower portion and upper portion of the cloak-shaped epitaxial region 110 may have different germanium percentages. For example, the upper portion may have a higher germanium percentage than the lower portion. This structure may be used for forming a p-type FinFET. Alternatively, the upper portion may have a lower germanium percentage than the lower portion of the cloak-shaped epitaxial region 110. This structure may be used for forming an n-type FinFET.

Figure 6:
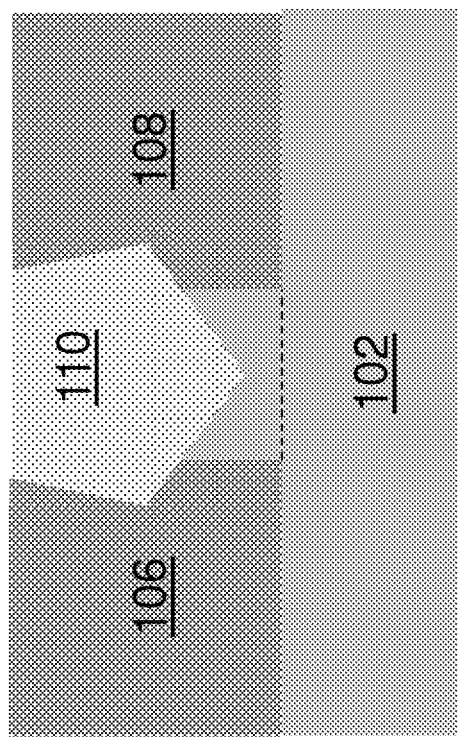
FIG. 6 illustrates a cross sectional view of the semiconductor device illustrated in FIG. 5 after a chemical mechanical polishing process has been applied to the protruded portion of the silicon germanium epitaxial region in accordance with an embodiment.

FIG. 6 illustrates a cross sectional view of the semiconductor device illustrated in FIG. 5 after a chemical mechanical polishing process has been applied to the protruded portion of the silicon germanium epitaxial region in accordance with an embodiment. According to the fabrication processes of the silicon germanium FinFET, the protruded portion from the silicon germanium epitaxial growth is removed so as to achieve a planar surface as shown in FIG. 6. In particular, the protruded portion of the silicon germanium epitaxial region shown in FIG. 5 is ground away until the top surface of the silicon germanium portion is level with the top surface of the adjacent isolation regions (e.g., isolation region 106).

The removal process may be implemented by using suitable techniques such as grinding, polishing and/or chemical etching. In accordance with an embodiment, the removal process may be implemented by using a CMP process. In the CMP process, a combination of etching materials and abrading materials are put into contact with the top surface of the silicon germanium region 110 and a grinding pad (not shown) is used to grind away the protruded portion until a desired planarization surface is achieved.

Figure 7:
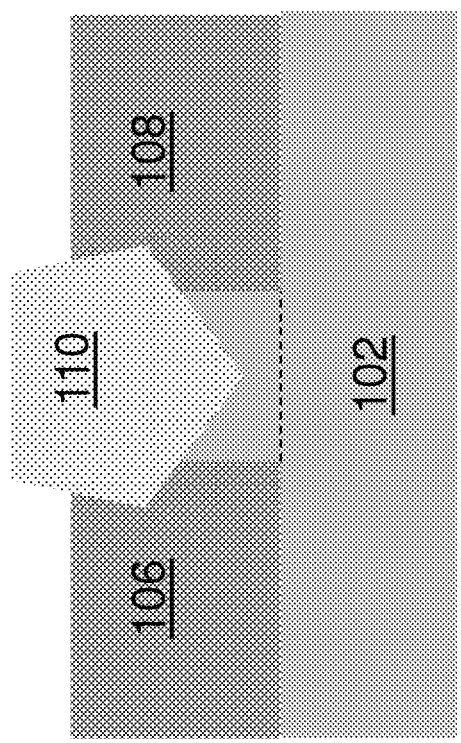
FIG. 7 illustrates a cross sectional view of the substrate shown in FIG. 6 after the upper portions of the STI structures are removed in accordance with an embodiment.

FIG. 7 illustrates a cross sectional view of the semiconductor device shown in FIG. 6 after the upper portions of the isolation regions are removed in accordance with an embodiment. The formation process of a FinFET may include recessing isolation regions 106 and 108, so that the resulting top surfaces of the isolation regions 106 and 108 are lower than the top surface of the cloak-shaped epitaxial region 110. The portion of the cloak-shaped epitaxial region 110 higher than the top surfaces of the isolation regions 106 and 108 forms a semiconductor fin.

Figure 8:
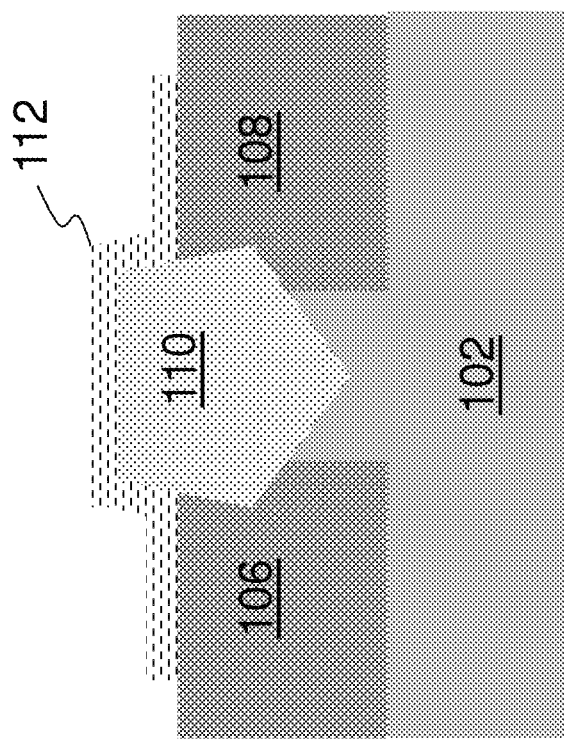
FIG. 8 illustrates a cross sectional view of the substrate shown in FIG. 7 after a gate dielectric layer is formed in accordance with an embodiment.

FIG. 8 illustrates a cross sectional view of the substrate shown in FIG. 7 after a gate dielectric layer is formed in accordance with an embodiment. The gate dielectric layer 112 may be formed of oxide materials and formed by suitable oxidation processes such as wet or dry thermal oxidation, sputtering or by CVD techniques using tetra-ethyl-ortho-silicate (TEOS) and oxygen as a precursor. In addition, the gate dielectric layer 112 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like.

Figure 9:
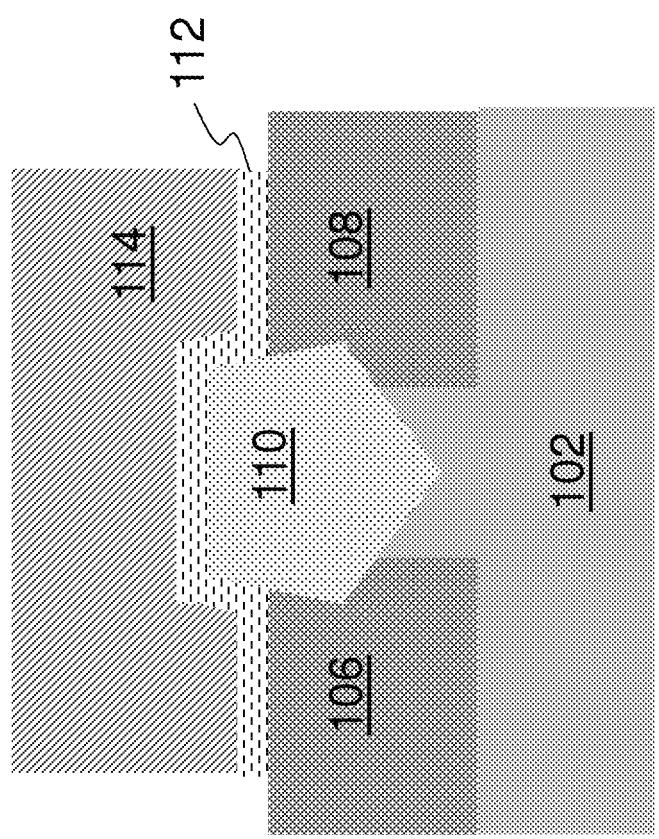
FIG. 9 illustrates a cross sectional view of the substrate shown in FIG. 8 after a gate electrode is formed in accordance with an embodiment.

FIG. 9 illustrates a cross sectional view of the substrate shown in FIG. 8 after a gate electrode is formed in accordance with an embodiment. The gate electrode 114 may comprise a conductive material selected from a group comprising of polycrystalline-silicon (poly-Si), poly-crystalline silicon-germanium (poly-SiGe), metal materials, metal silicide materials, metal nitride materials, metal oxide materials and the like. For example, metal materials may include tantalum, titanium, molybdenum, tungsten, platinum, aluminum, hafnium, ruthenium, a combination thereof and the like. Metal silicide materials include titanium silicide, cobalt silicide, nickel silicide, tantalum silicide, a combination thereof and the like. Metal nitride materials include titanium nitride, tantalum nitride, tungsten nitride, a combination thereof and the like. Metal oxide materials include ruthenium oxide, indium tin oxide, a combination thereof and the like.

It should be noted that other fabrication processes may be used to form the gate electrode. Other fabrication processes include but is not limited to CVD, physical vapor deposition (PVD), plasma enhanced CVD (PECVD), atmospheric pressure CVD (APCVD), high density plasma CVD (HD CVD), low-pressure chemical vapor deposition (LPCVD), atomic layer CVD (ALCVD) and the like.

It should be noted that there may be a non-planar surface after the gate electrode 114 is formed. A CMP process may be employed to planarize the top surface of the gate. The CMP process has been described above with respect to FIG. 6, and hence is not described in detail herein to avoid repetition.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a first isolation region formed in a substrate, wherein the first isolation region has a first non-vertical sidewall;
   a second isolation region formed in the substrate, wherein the second isolation region has a second non-vertical sidewall;
   a V-shaped groove formed in the substrate, wherein the V-shaped groove, the first non-vertical sidewall and the second non-vertical sidewall form a cloak-shaped recess in the substrate;
   a cloak-shaped active region formed in the cloak-shaped recess over the substrate, wherein the cloak-shaped active region has an upper portion protruding above a top surface of the isolation region, a first triangular region embedded in the first isolation region, a second triangular region embedded in the second isolation region and a V-shaped bottom portion, and wherein the cloak-shaped active region comprises:
      a first drain/source region;
      a second drain/source region; and
      a channel between the first drain/source region and the second drain/source region; and
   a gate electrode wrapping the channel of the cloak-shaped active region.

2. The apparatus of claim 1, further comprising:
   a gate dielectric layer formed between the cloak-shaped active region and the gate electrode.

3. The apparatus of claim 1, wherein the cloak-shaped active region is formed of silicon germanium.

4. The apparatus of claim 1, wherein a turning point angle formed by the first non-vertical sidewall and the V-shaped groove is a range from about 130 degrees to about 160 degrees.

5. The apparatus of claim 1, wherein the first isolation region is a shallow trench isolation structure.

6. The apparatus of claim 1, wherein the V-shaped groove has an interior angle in a range from about 100 degrees to about 110 degrees.

7. The apparatus of claim 1, wherein the gate electrode, the first drain/source region, the second drain/source region and the channel form a FinFET.

8. A device comprising:
   a first drain/source region formed in a substrate;
   a second drain/source region formed in the substrate;
   a channel between the first drain/source region and the second drain/source region, wherein the first drain/source region, the second drain/source region and the channel form a cloak-shaped active region, wherein the cloak-shaped active region has a V-shaped bottom and wherein a first triangular region of the cloak-shaped active region is embedded in a first isolation region and a second triangular region of the cloak-shaped active region is embedded in a second isolation region; and
   a gate electrode wrapping the channel.

9. The device of claim 8, wherein the V-shaped bottom has an interior angle in a range from about 100 degrees to about 110 degrees.

10. The device of claim 8, further comprising:
    a first isolation region formed in the substrate;
    a second isolation region formed in the substrate, wherein the first isolation region and the second isolation region are formed on opposite sides of the cloak-shaped active region; and
    a gate dielectric layer formed between the gate electrode and the cloak-shaped active region.

11. The device of claim 10, wherein the gate dielectric layer comprises:
    a first portion formed between the first isolation region and the gate electrode;
    a second portion formed between a first sidewall of the cloak-shaped active region and the gate electrode;
    a third portion formed between a top surface of the cloak-shaped active region and the gate electrode;
    a fourth portion formed between a second sidewall of the cloak-shaped active region and the gate electrode; and
    a fifth portion formed between the second isolation region and the gate electrode.

12. The device of claim 10, wherein:
    the first isolation region comprises a shallow trench isolation structure; and
    the second isolation region comprises the shallow trench isolation structure.

13. The device of claim 8, wherein:
    the first drain/source region is formed of silicon germanium;
    the second drain/source region is formed of silicon germanium; and
    the channel is formed of silicon germanium.

* * * * *